(12) United States Patent
Turker Melek et al.

(10) Patent No.: US 10,868,663 B1
(45) Date of Patent: Dec. 15, 2020

(54) FLEXIBLE WIDE-RANGE AND HIGH BANDWIDTH AUXILIARY CLOCK AND DATA RECOVERY (CDR) CIRCUIT FOR TRANSCEIVERS

(71) Applicant: Xilinx, Inc., San Jose, CA (US)

(72) Inventors: Didem Z. Turker Melek, San Jose, CA (US); Mayank Raj, San Jose, CA (US); Adebabay M. Bekele, San Jose, CA (US); Parag Upadhyaya, Los gatos, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/870,505

(22) Filed: May 8, 2020

(51) Int. Cl.
| | | |
|---|---|---|
| H03H 7/30 | (2006.01) | |
| H03D 3/24 | (2006.01) | |
| H04L 7/033 | (2006.01) | |
| H03L 7/087 | (2006.01) | |
| H03L 7/099 | (2006.01) | |
| H04L 25/03 | (2006.01) | |
| H04B 1/00 | (2006.01) | |

(Continued)

(52) U.S. Cl.
CPC .......... H04L 7/0331 (2013.01); H03L 7/087 (2013.01); H03L 7/0992 (2013.01); H04B 1/0028 (2013.01); H04B 1/16 (2013.01); H04L 25/03019 (2013.01); H04L 27/36 (2013.01)

(58) Field of Classification Search
CPC . H04L 7/0331; H04L 25/03019; H04L 27/36; H03L 7/0992; H03L 7/087; H04B 1/16; H04B 1/0028

USPC .......... 375/232, 362, 364, 373–376
See application file for complete search history.

(56) References Cited

U.S. PATENT DOCUMENTS

| | | | | |
|---|---|---|---|---|
| 2008/0124092 A1* | 5/2008 | Dvir | ................ | H04L 7/005 398/155 |
| 2008/0219390 A1* | 9/2008 | Simpson | ................ | H04L 7/033 375/355 |

(Continued)

OTHER PUBLICATIONS

Frans, Yohan et al., A 0.5-16.3 Gb/s Fully Adaptive Flexible-Reach Transceiver for FPGA in 20 nm CMOS, IEEE Journal of Solid-State Circuits, vol. 50, No. 8, Aug. 2015, 13 pages.

(Continued)

Primary Examiner — Don N Vo
(74) Attorney, Agent, or Firm — Craige Thompson, Thompson Patent Law

(57) ABSTRACT

Apparatus and associated methods relate to implementing an analog auxiliary clock and data recovery (CDR) path to provide a high bandwidth CDR in a transceiver that supports both PAM4 and NRZ signaling. In an illustrative example, the auxiliary CDR path may include a phase-frequency detector (PFD)-based phase-locked loop (PLL) and a phase detector (PD)-based PLL. When the PFD-based PLL is locked to a reference clock signal of the transceiver, the PFD-based PLL may be then disabled and the PD-based PLL may be then enabled. Implementing the auxiliary CDR path may advantageously enable the transceiver to implement much larger parts per million (ppm) acquisition and tracking, and thus enable the transceiver to advantageously support new standards such as Peripheral Component Interconnect Express (PCIe) 5.0 and PCIe 6.0, for example.

20 Claims, 11 Drawing Sheets

(51) Int. Cl.
*H04B 1/16* (2006.01)
*H04L 27/36* (2006.01)

(56) References Cited

U.S. PATENT DOCUMENTS

| | | | |
|---|---|---|---|
| 2014/0169442 A1* | 6/2014 | Hashida | H04L 25/03057 375/233 |
| 2015/0312078 A1* | 10/2015 | Bogdan | H03L 7/0995 375/226 |
| 2016/0013927 A1* | 1/2016 | Lee | H03L 7/0807 375/371 |

OTHER PUBLICATIONS

Xilinx, Inc., Clock Data Recovery Design Techniques for E1/T1 Based on Direct Digital Synthesis, Application Note: Virtex and Spartan FPGA Families, XAPP868 (v1.0), Jan. 29, 2008, 11 pages, San Jose, CA USA.

Xilinx, Inc., Virtex UltraScale+ FPGAs GTM Transceivers, User Guide, UG581 (v1.2) Sep. 20, 2019, 152 pages, San Jose, CA USA.

\* cited by examiner

US 10,868,663 B1

FLEXIBLE WIDE-RANGE AND HIGH BANDWIDTH AUXILIARY CLOCK AND DATA RECOVERY (CDR) CIRCUIT FOR TRANSCEIVERS

TECHNICAL FIELD

Various embodiments relate generally to integrated circuits, and more specifically, to clock and data recovery circuit.

BACKGROUND

Clock data recovery (CDR) circuit is an important block in a receiver system for high-speed serial communications. The CDR circuit may generate the correct sampling clock phase for data recovery. The quality of the high-speed serial communication link may be sensitive to the sampling clock phase, especially in the presence of jitter and noise.

In a receiver having a phase interpolator that determines a clock phase for sampling the incoming data, the CDR circuit may be used to identify if the currently used dock phase is the best to capture the incoming data. The CDR circuit may provide dynamic phase adjustments for the phase interpolator. The CDR circuit may operate to move the dock phase location towards the center of the data eye. The farther the current dock phase is from the center of the data eye, the longer it takes for the CDR circuit to lock to the correct dock phase. Long locking times may lead to data loss.

One type of existing CDR circuit is an edge-sampled CDR circuit. An edge-sampled CDR circuit may oversample the analog input waveform to generate the correct data sampling clock and recover the transmitted data. The edge-sampled CDR circuit may assume the data to be sampled as around the center between Zero-crossing points. The resulting oversampled system may consume more clocking power than a system operating at the symbol rate (also referred to as baud-rate). Further, as the channel loss profile changes, the analog waveform to be sampled may be not necessarily symmetric. Thus, maintaining the data sampling clock at the center between Zero-crossing points may be sub optimal.

SUMMARY

Apparatus and associated methods relate to implementing an analog auxiliary clock and data recovery (CDR) path to provide a high bandwidth CDR in a transceiver that supports both PAM4 and NRZ signaling. In an illustrative example, the auxiliary CDR path may include a phase-frequency detector (PFD)-based phase-locked loop (PLL) and a phase detector (PD)-based PLL. When the PFD-based PLL is locked to a reference clock signal of the transceiver, the PFD-based PLL may be then disabled and the PD-based PLL may be then enabled. Implementing the auxiliary CDR path may advantageously enable the transceiver to implement much larger parts per million (ppm) acquisition and tracking, and thus enable the transceiver to advantageously support new standards such as Peripheral Component Interconnect Express (PCIe) 5.0 and PCIe 6.0, for example.

Various embodiments may achieve one or more advantages. For example, some embodiments may enable the transceiver to implement much larger parts per million (ppm) acquisition and tracking, and thus enable the transceiver to support new standards such as PCIe 5.0 and PCIe 6.0 while having better clock noise filtering characteristic, leading to an improved jitter performance. In some embodiments, the auxiliary CDR path may be implemented in a programmable logic block (e.g., field programmable gate array), such that the transceiver may be able to support multiple data rates and flexible channels.

In some embodiments, the auxiliary CDR path may advantageously provide the transceiver/receiver suitable to implement high bandwidth CDR structures that may acquire and track large frequency ppm between the reference clock signal and an incoming data, especially for ADC-based receivers. The high bandwidth CDR structures may also advantageously lead to a large acquisition range and track large spread spectrum clocking (SSC) ppm patterns. Some embodiments may enable the transceiver to meet and exceed the static and dynamic ppm tracking requirements (e.g., around 3400 ppm) for PCIe 5.0 and PCIe 6.0, for example. In some embodiments, an equalizer in the auxiliary CDR path may be over peaked and doesn't need to be strictly linear to make the design of the auxiliary CDR path simpler.

In some embodiments, the auxiliary CDR path may advantageously achieve a wide frequency range operation and support 112 Gbps PAM4, 64 Gbps PAM4, 56 Gbps NRZ, and 32 Gbps NRZ operation and high loss (e.g., around 30 dB) to low loss (e.g., around 0 dB) channels. In some embodiments, the use of such a nonlinear peaking stage followed by an oversampled analog PLL may advantageously extract the Nyquist frequency and enable the oversampled analog PLL to lock to the Nyquist frequency. Some embodiments may use the PLL in the auxiliary CDR path to achieve lock in by first frequency locking with a PFD path to an on-chip reference to bring the PLL frequency within the acquisition range and switching to a PD path of the PLL to lock to the incoming data. By doing this, many subblocks (e.g., loop filter, VCO) of the PLL between the PFD mode and the PD mode may be shared. The loop filter may also be programmed to have different characteristics to make the PLL stable in both the PFD mode and the PD mode.

In one exemplary aspect, an integrated circuit includes an analog-to-digital converter (ADC)-based receiver configured to receive an incoming data signal in response to a reference clock signal, a clock generation circuit configured to receive the reference clock signal and generate a first clock signal, an analog auxiliary clock and data recovery (AUX CDR) circuit configured to oversample the incoming data signal and generate a second clock signal, a selection circuit configured to receive the first clock signal and the second clock signal and output a selected clock signal in response to a selection signal, and, a phase interpolator (PI) configured to provide a sampling clock signal to an ADC in the ADC-based receiver in response to a PI code and the selected clock signal. The selection circuit is configured to output the second clock signal when a phase-frequency detector (PFD)-based phase-locked loop (PLL) in the AUX CDR circuit is locked to the reference clock signal.

In some embodiments, the AUX CDR circuit may include an analog equalizer configured to receive the incoming data signal and generate a first equalized signal and a phase-locked loop (PLL) configured to receive the incoming data signal, the first equalized signal, and the reference clock signal to generate the second clock signal. The PLL may include the PFD-based PLL configured to receive the reference clock signal to generate a third clock signal, and a phase detector (PD)-based PLL configured to receive the incoming data signal, the first equalized signal, and the third clock signal to generate the second clock signal. When the PFD-based PLL is locked to the reference clock signal, the PFD-based PLL may be disabled and the PD-based PLL may be enabled in response to a set of control signals.

In some embodiments, the analog equalizer may include a continuous time linear equalizer. In some embodiments, the PLL may include a first divider configured to receive the reference clock signal, a phase-frequency detector (PFD) coupled to an output of the first divider, a first charge pump circuit coupled to an output of the PFD through a first switch, a phase detector (PD) configured to receive the incoming data signal and the first equalized signal, a second charge pump circuit coupled to an output of the PFD through a second switch, a loop filter coupled to both the first charge pump circuit and the second charge pump circuit, and, a voltage-controlled oscillator (VCO) coupled to the loop filter to provide a number of clock signals. The phase detector (PD) may be configured to receive the incoming data signal and the first equalized analog signal in response to the number of clock signals to capture a number of samples of the incoming data signal. In some embodiments, the VCO may include a ring VCO.

In some embodiments, the AUX CDR circuit may include a state machine operably coupled to the PFD-based PLL and the PD-based PLL, and, a data store coupled to the state machine and containing a program of instructions that, when executed by the state machine, cause the state machine to perform operations to control the PFD-based PLL and the PD-based PLL. The operations may include generating a first set of control signals to enable the PFD-based PLL and disable the PD-based PLL, determining whether the PFD-based PLL is locked to the reference clock signal, and, if the PFD-based PLL is locked to the reference clock signal, then generating a second set of control signals to disable the PFD-based PLL and enable the PD-based PLL.

In some embodiments, the operations may include generating the first set of control signals to assign a first predetermined set of resistance value and capacitance values to a loop filter in both the PFD-based PLL and the PD-based PLL, and, generating the second set of control signals to assign a second predetermined set of resistance value and capacitance values to the loop filter. In some embodiments, the operations may include generating a first selection signal to enable the selection circuit to output the first clock signal, determining whether the PFD-based PLL is locked to the reference clock signal, and, if the PFD-based PLL is locked to the reference clock signal, then generating a second selection signal to enable the selection circuit to output the second clock signal.

In another exemplary aspect, an integrated circuit is configured to receive an incoming data signal in response to a reference clock signal. The integrated circuit includes an analog-to-digital converter (ADC) configured to convert the incoming data signal into a digital data signal in response to a sampling clock signal, a decision circuit configured to receive the digital data signal and generate data samples and error samples, a first clock and data recovery (CDR) circuit configured to generate a control signal in response to the data samples and error samples, a clock generation circuit configured to receive the reference clock signal and generate a first clock signal, a second clock and data recovery (AUX CDR) circuit configured to oversample the incoming data signal and generate a second clock signal, a selection circuit configured to receive the first clock signal and the second clock signal and output a selected clock signal in response to a selection signal, and, a phase interpolator (PI) configured to provide the sampling clock signal in response to a PI code and the selected clock signal. The selection circuit is configured to output the second clock signal when a phase-frequency detector (PFD)-based phase-locked loop (PLL) in the second CDR circuit is locked to the reference clock signal.

In some embodiments, the second CDR circuit may include an analog equalizer configured to receive the incoming data signal and generate a first equalized signal, and, a phase-locked loop (PLL) configured to receive the incoming data signal, the first equalized signal, and the reference clock signal to generate the second clock signal. The PLL may include the PFD-based PLL configured to receive the reference clock signal to generate a third clock signal, and, a phase detector (PD)-based PLL configured to receive the incoming data signal, the first equalized signal, and the third clock signal to generate the second clock signal. When the PFD-based PLL is locked to the reference clock signal, the PFD-based PLL may be disabled and the PD-based PLL may be enabled in response to a set of control signals.

In some embodiments, the analog equalizer may include a continuous time linear equalizer. In some embodiments, the second CDR circuit may include a state machine operably coupled to the PFD-based PLL and the PD-based PLL, and, a data store coupled to the state machine and containing a program of instructions that, when executed by the state machine, cause the state machine to perform operations to control the PFD-based PLL and the PD-based PLL. The operations may include generating a first set of control signals to enable the PFD-based PLL and disable the PD-based PLL, determining whether the PFD-based PLL is locked to the reference clock signal, and, if the PFD-based PLL is locked to the reference clock signal, then generating a second set of control signals to disable the PFD-based PLL and enable the PD-based PLL.

In some embodiments, the operations may include generating the first set of control signals to assign a first predetermined set of resistance value and capacitance values to a loop filter in both the PFD-based PLL and the PD-based PLL, and, generating the second set of control signals to assign a second predetermined set of resistance value and capacitance values to the loop filter. In some embodiments, the operations may include generating a first selection signal to enable the selection circuit to output the first clock signal, determining whether the PFD-based PLL is locked to the reference clock signal, and, if the PFD-based PLL is locked to the reference clock signal, then generating a second selection signal to enable the selection circuit to output the second clock signal. In some embodiments, the first clock and data recovery (CDR) circuit may include a baud rate CDR circuit.

In another exemplary aspect, a method includes configuring an analog-to-digital converter (ADC)-based receiver to receive an incoming data signal in response to a reference clock signal, configuring a clock generation circuit to receive the reference clock signal and generate a first clock signal, configuring an analog auxiliary clock and data recovery (AUX CDR) circuit to oversample the incoming data signal and generate a second clock signal, configuring a selection circuit to receive the first clock signal and the second clock signal and output a selected clock signal in response to a selection signal, configuring a phase interpolator (PI) to provide a sampling clock signal to an ADC in the ADC-based receiver in response to a PI code and the selected clock signal, and, configuring the selection circuit to output the second clock signal when a phase-frequency detector (PFD)-based phase-locked loop (PLL) in the AUX CDR circuit is locked to the reference clock signal.

In some embodiments, configuring the AUX CDR circuit may include configuring an analog equalizer to receive the incoming data signal and generate a first equalized signal, and, configuring a phase-locked loop (PLL) to receive the incoming data signal, the first equalized signal, and the reference clock signal to generate the second clock signal. Configuring the PLL may include configuring the PFD-based PLL to receive the reference clock signal to generate a third clock signal, and, configuring a phase detector (PD)-based PLL to receive the incoming data signal, the first equalized signal, and the third clock signal to generate the second clock signal. When the PFD-based PLL is locked to the reference clock signal, the PFD-based PLL may be disabled and the PD-based PLL may be enabled in response to a set of control signals. In some embodiments, the analog equalizer may include a continuous time linear equalizer.

In some embodiments, the PLL may include a first divider configured to receive the reference clock signal, a phase-frequency detector (PFD) coupled to an output of the first divider, a first charge pump circuit coupled to an output of the PFD through a first switch, a phase detector (PD) configured to receive the incoming data signal and the first equalized signal, a second charge pump circuit coupled to an output of the PFD through a second switch, a loop filter coupled to both the first charge pump circuit and the second charge pump circuit, and, a voltage-controlled oscillator (VCO) coupled to the loop filter to provide a number of clock signals. The phase detector (PD) may be configured to receive the incoming data signal and the first equalized analog signal in response to the number of clock signals to capture a number of samples of the incoming data signal.

In some embodiments, configuring the AUX CDR circuit may include providing a state machine and operably coupling the state machine to the PFD-based PLL and the PD-based PLL, and, coupling a data store to the state machine, wherein the data store contains a program of instructions that, when executed by the state machine, cause the state machine to perform operations to control the PFD-based PLL and the PD-based PLL. The operations may include generating a first set of control signals to enable the PFD-based PLL and disable the PD-based PLL, determining whether the PFD-based PLL is locked to the reference clock signal, and, if the PFD-based PLL is locked to the reference clock signal, then generating a second set of control signals to disable the PFD-based PLL and enable the PD-based PLL.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to implementing an analog auxiliary clock and data recovery (CDR) path to provide a high bandwidth CDR in a transceiver that supports both PAM4 and NRZ signaling. In an illustrative example, the auxiliary CDR path may include a phase-frequency detector (PFD)-based phase-locked loop (PLL) and a phase detector (PD)-based PLL. When the PFD-based PLL is locked to a reference clock signal of the transceiver, the PFD-based PLL may be then disabled and the PD-based PLL may be then enabled. Implementing the auxiliary CDR path may advantageously enable the transceiver to implement much larger parts per million (ppm) acquisition and tracking, and thus enable the transceiver to advantageously support new standards such as Peripheral Component Interconnect Express (PCIe) 5.0 and PCIe 6.0, for example.

To aid understanding, this document is organized as follows. First, an exemplary platform (e.g., a field programmable gate array FPGA) suitable to perform data communication is briefly introduced with reference to FIG. 1. Second, with reference to FIGS. 2A-4B, the discussion turns to exemplary embodiments that illustrate schematics of an auxiliary CDR circuit and methods to operate the auxiliary CDR circuit. Then, with reference to FIGS. 5-6, exemplary simulation results of the performance of the auxiliary CDR circuit are discussed. Finally, with reference to FIG. 7, another exemplary platform (e.g., a system-on-Chip (SOC)) suitable to perform data communication and CDR is briefly introduced.

Figure 1:
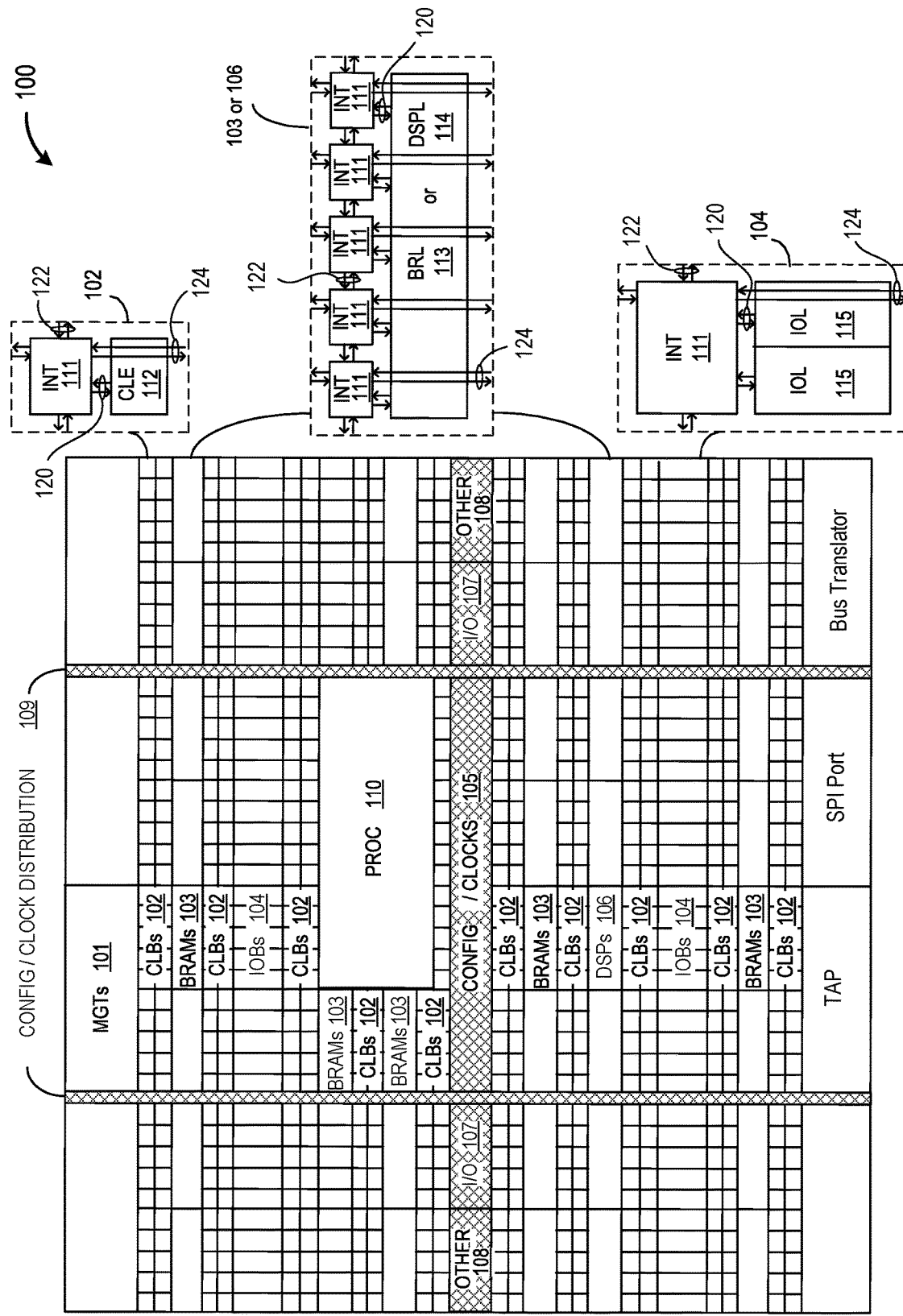
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

High speed digital (HSD) integrated circuits (ICs) may be used in Serializer/Deserializer (SerDes) systems. In such systems, new standards such as Peripheral Component Interconnect Express (PCIe) 5.0 and PCIe 6.0 require large static and dynamic parts per million (ppm) acquisition and tracking. For example, for PCIe 5.0, the ppm difference between the transmitter and receiver can be as high as around 3400 ppm in separate reference clock independent (SRIS) mode. However, as data rates of transceivers go higher to enable large amounts of data processing, alternative signaling methods such as pulse-amplitude modulation 4-Level (PAM4) signaling are utilized and analog-to-digital converter (ADC) based receiver architectures are preferred. To reduce the large latency (e.g., introduced by the feedback loop of the receiver which includes the data processing) of such receiver architectures and support large clock and data recovery (CDR) bandwidth, a receiver having an auxiliary CDR circuit is discussed below to implement much larger ppm acquisition and tacking, and enabling the receiver to support new standards such as PCIe 5.0 and PCIe 6.0 while having improved jitter performance.

Figure 2A:
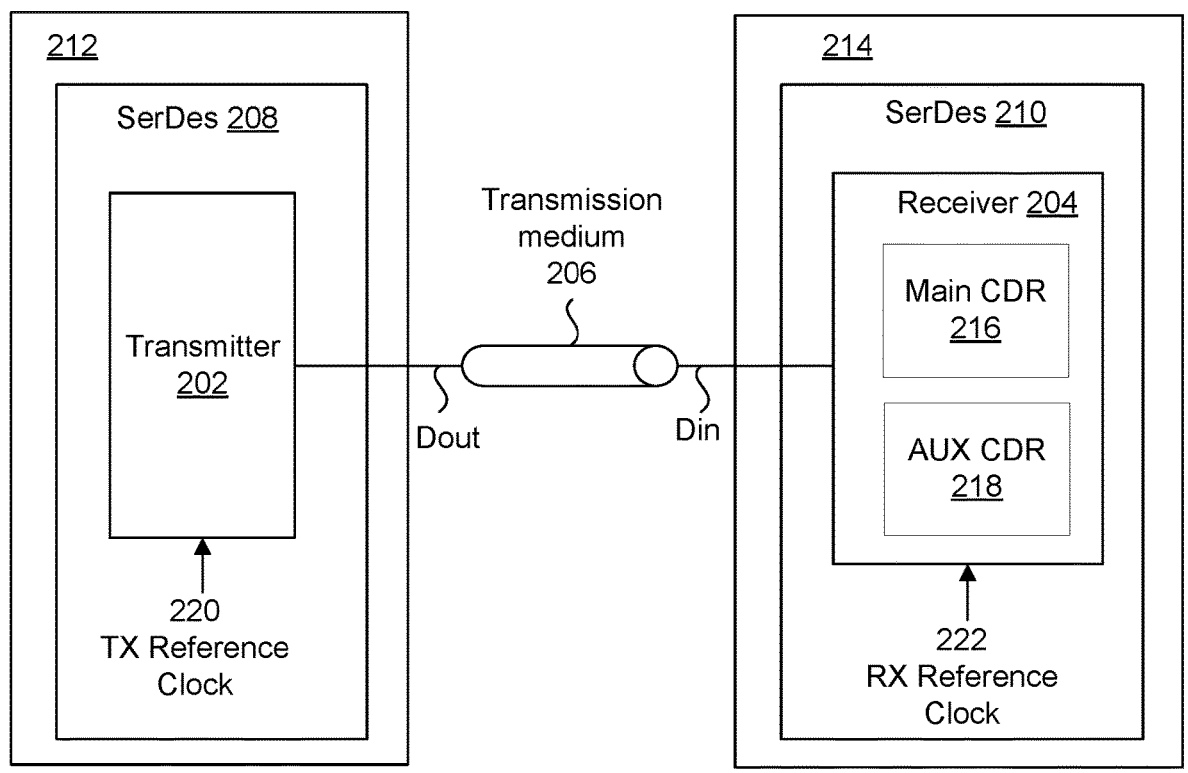
FIG. 2A depicts an exemplary receiver having an exemplary auxiliary clock and data recovery (CDR) circuit implemented in an exemplary communication system.

FIG. 2A depicts an exemplary receiver having an exemplary auxiliary clock and data recovery (CDR) circuit implemented in an exemplary communication system. In this depicted example, an exemplary communication system 200 includes a transmitter 202 configured to transmit data $D_{out}$ to a receiver 204 over transmission medium 206. The receiver 204 may advantageously reduce the latency by implementing a fast auxiliary over-sampled CDR path that works alongside a slow CDR feedback loop.

The transmission medium 206 may degrade the signal quality of the transmitted signal $D_{out}$. The data signal received by the receiver 204 may be defined as $D_{in}$. The received data $D_{in}$ may require reconstruction (equalization) before use. The receiver 204 may advantageously reduce the latency by implementing a fast auxiliary over-sampled CDR path that works alongside a slow CDR feedback loop.

The transmitter 202 may be part of a serializer-deserializer (SerDes) 208. The receiver 204 may also be part of a SerDes 210. The transmission medium 206 may include printed circuit board (PCB) traces, vias, cables, connectors, decoupling capacitors, and the like. In some embodiments, the SerDes 208 may be disposed in an integrated circuit (IC) 212, and the SerDes 210 may be disposed in an IC 214.

The transmitter 202 drives serial data onto the transmission medium 206 using, for example, a digital baseband modulation technique. In general, the serial data is divided into symbols. The transmitter 202 converts each symbol into an analog voltage mapped to the symbol. The transmitter 202 couples the analog voltage generated from each symbol to the transmission medium 206. In some embodiments, the transmitter 202 may use a binary non-return-to-zero (NRZ) modulation scheme. In binary NRZ, a symbol may be one bit of the serial data and two analog voltages may be used to represent each bit. In some examples, the transmitter 202 may use multi-level digital baseband modulation techniques, such as pulse amplitude modulation (PAM), where a symbol includes a plurality of bits of the serial data and more than two analog voltages may be used to represent each bit.

The receiver 204 may include a main clock and data recovery (CDR) circuit 216. The main CDR circuit 216 operates to recover data and clock from the analog signal $D_{in}$. The receiver 204 provides the recovered data to, for example, physical coding sublayer (PCS) circuitry (not shown) in SerDes 210 for decoding and further processing. The receiver 204 may also include an auxiliary CDR circuit 218 such that the receiver 204 may implement much larger ppm acquisition and tacking and support new standards such as PCIe 5.0 and PCIe 6.0 while having improved jitter performance. An exemplary architecture of the receiver 204 is discussed in further detail with reference to FIG. 2B.

As illustrated in FIG. 2A, the transmitter 202 may use a transmitter (TX) reference clock signal 220, and the receiver 204 may use a receiver (RX) reference clock signal 222. In some embodiments, there may be a difference between the TX reference clock signal 220 and the RX reference clock signal 222, which may be referred to as a frequency offset between the transmitter reference clock and the receiver reference clock signal 222. A frequency reference offset may exist when the TX reference clock signal 220 and the RX reference clock signal 222 use independent clock sources (e.g., clock sources that are nominally but not exactly identical in frequency). In some embodiments, the frequency offset may be fixed (e.g., equal to a constant). In some embodiments, the frequency offset may not be fixed, for example, may be a periodic function of time.

Figure 2B:
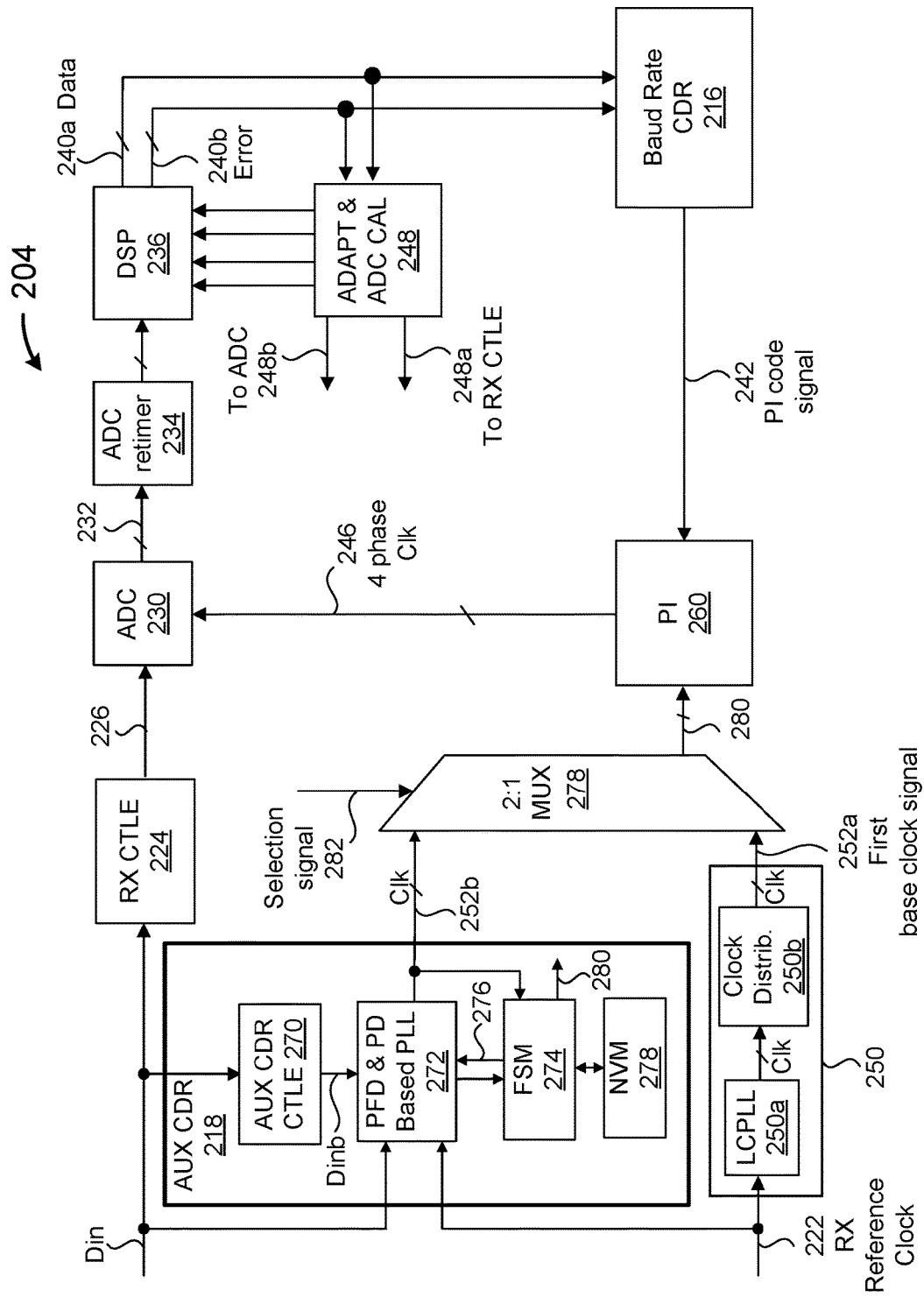
FIG. 2B depicts a block diagram of an exemplary receiver.

FIG. 2B depicts a block diagram of an exemplary receiver. The receiver 204 includes a first continuous time linear equalizer (CTLE) 224. The first CTLE 224 is coupled to receive the analog signal $D_{in}$ from the transmission medium 206. The first CTLE 224 may operate as a high-pass filter or band-pass filter to compensate for the low-pass characteristics of the transmission medium 206. The peak of the frequency response of the first CTLE 224 may be adjusted by an adaptation and calibration circuit 248.

The first CTLE 224 outputs a first equalized analog signal 226. The first equalized analog signal 226 is then received by an analog-to-digital converter (ADC) 230. The ADC 230 may convert the first equalized analog signal 226 into a digital signal 232 in response to a sampling clock signal 246. In some embodiments, the receiver 204 may also include an ADC retimer 234. The ADC retimer 234 may be used as a clock unification stage (e.g., to sample data safety with single clock of an interleaved ADC).

A decision signal processing (DSP) circuit 236 (e.g., including a decision feedback equalizer (DFE) and/or feed forward equalizer (FFE)) is coupled to the output of the ADC 230 or the ADC retimer 234 and receives the digital signal 232. The ADC retimer 234 may also be used for clean capture of data by the DSP. The DSP circuit 236 may be operable to equalize the digital signal 232 to compensate for, for example, post-cursor inter-symbol interference (ISI). In this depicted example, the DPS circuit 236 may include slicers configured to sample the digital signal 232 to generate a data sample 240a and an error sample 240b per symbol k.

In some embodiments, the slicers may include separate data slicers and error slicers. In some embodiments, the slicers may include, for example, four error slicers. In some embodiments, each of the slicers may sample its input signal using a sampling clock at the baud-rate (symbol rate) to generate the data and error samples. The data samples 240a may include estimated values for the symbols, and the error samples 240b may include estimated decision errors for the symbols. Each data sample 240a and each error sample 240b may include one or more bits depending on the type of modulation scheme employed (e.g., one-bit samples for binary NRZ and multi-bit samples for PAM).

The main CDR circuit 216 is coupled to the outputs of the DSP circuit 236 to receive the data samples 240a and error samples 240b. In this depicted example, the main CDR circuit 216 employs the baud-rate phase detection CDR architecture. The main CDR circuit 216 generates a phase interpolator (PI) code signal 242 in response to the received data samples 240a and error samples 240b.

The receiver 204 also includes a clock generation circuit 250 configured to receive the RX reference clock signal 222 and generate a first base clock signal 252a. In this depicted example, the clock generation circuit 250 includes a first phase-locked loop (PLL) configured to receive the RX reference clock signal 222 to generates the first base clock signal 252a. In this depicted example, the first PLL includes a LC-tank based PLL (LCPLL). In some embodiments, the clock generation circuit 250 may also include a clock distribution circuit 250b configured to distribute the first base clock signal 252a to other elements in the receiver 204.

In this depicted example, the receiver 204 also includes a phase interpolator (PI) 260. The PI 260 receives the first base clock signal 252a from the clock generation circuit 250. The PI 260 may shift the phase of the first base clock signal 252a based on the PI code signal 242 output by the main CDR circuit 216. The PI 260 may output the phase-shifted clock signal as the sampling clock signal 246 used by the ADC 230, for example. In some embodiments, the phase interpolator 260 may produce fine, evenly spaced sampling phases to allow the main CDR circuit 216 to have fine phase control. The main CDR circuit 216 may track the incoming data signal $D_{in}$ that can have a frequency offset from the local PLL reference clock (e.g., the RX reference clock 222). In some embodiments, the main CDR circuit 216 may include a phase detector configured to receive the data samples 240a and error samples 240b to generate the PI code signal 242. In some embodiments, the PI 260 may be replaced by, for example, a phase interpolator and an in-phase and quadrature phase generator.

The data samples 240a and error samples 240b are also received by the adaptation and calibration circuit 248. In some embodiments, the adaptation and calibration circuit 248 may generate control signals 248a for the first CTLE 224 and control signals 248b for the calibration of the ADC 230. In some embodiments, the adaptation and calibration circuit 248 may also generate an adaptation control code to adapt the decision circuits (e.g., DFE,FFE) in the DSP 236, using known algorithms.

To reduce the large latency of ADC-based receiver architectures and support large clock and data recovery (CDR) bandwidth, the receiver 204 is configured to have the AUX CDR circuit 218 to implement much larger ppm acquisition and tacking, and enabling the receiver to support new standards such as PCIe 5.0 and PCIe 6.0 while having improved jitter performance.

The AUX CDR circuit 218 includes a second CTLE 270 configured to receive the analog signal $D_{in}$ from the transmission medium 206 The second CTLE 224 may include five stages of CTLE. The five stages of CTLE may be used with tcoils to provide a large amount of peaking (e.g., around 18 db of peaking) at, for example, 28 GHz. In some embodiments, the Tcoils may be coupled with inductors to provide inductive peaking in the CTLE's response in an area efficient manner. With this peaking, only the Nyquist content of the incoming data Din will be boosted, and the rest would be suppressed. In this depicted example, the second CTLE may be over peaked and doesn't need to be strictly linear in the AUX CDR circuit 218 to make the design of the AUX CDR circuit 218 simpler. The second CTLE 224 outputs a second equalized analog signal Dinb.

The AUX CDR circuit 218 also includes a second PLL 272 configured to receive the incoming data $D_{in}$, the second equalized analog signal Dinb, and the RX reference clock signal 222 to generates a second base clock signal 252b. In this depicted example, the second PLL includes a phase-frequency detector (PFD)-based PLL and a phase detector (PD)-based PLL. The second PLL may be configured to work in two different modes: PFD-based mode (e.g., only the PFD PLL is enabled) (e.g., clock path) and PD-based mode (e.g., only the PD PLL is enabled) (e.g., data path). A finite state machine (FSM) 274 is coupled to the second PLL 272 and configured to monitor the second PLL 272. The FSM 274 may send a control signal 276 to the second PLL 272 to configure the second PLL to work in different modes. In some embodiments, the FSM 274 may be coupled to a data store (e.g., non-volatile memory NVM 278) to execute programs stored in the data store. For example, the NVM 278 may store instructions that, when executed by the FSM 274, cause the FSM 274 to perform operations to generate control signals and selection signals, for example. The architecture of the second PLL 272 will be discussed in further detail with reference to FIG. 3.

The receiver 204 also includes a selection circuit 278 configured to receive the first base clock signal 252a (e.g., from the clock generation circuit 250) and the second base clock signal 252b (e.g., from the second PLL 272). In this depicted example, the selection circuit 278 is a two-input multiplexer. The two-input multiplexer 278 outputs a selected clock signal 280 in response to a selection signal 282. The selection signal 282 may be generated by the FSM 274. An auxiliary CDR path may be provided by applying the second base clock signal 252b to the PI 260. The auxiliary CDR path may provide a high bandwidth CDR in the receiver that supports, for example, both PAM4 and NRZ signaling such that much larger ppm acquisition and tracking may be supported by the receiver 204.

In some embodiments, the receiver 204 may also include an automatic gain control (AGC) circuit. An output of the first CTLE 224 may be coupled to an input of the AGC circuit. The AGC circuit may be used to control the gain of the high-pass filter. The gain of the AGC circuit may be also controlled by the adaptation circuit 242. In some embodiments, the AGC circuit may precede the first CTLE circuit 224. In other examples, the receiver 204 may include other types of continuous-time filters with or without amplification. In some embodiments, different algorithms may be used to make the first CTLE circuit 224 only look the first postcursor. In some embodiments, the receiver 204 may also include a deserializer (not shown) to group data samples 240a and error samples 240b to generate a deserialized signal to be processed by the main CDR circuit 216.

The exemplary operation of the receiver 204 is now explained. When the AUX CDR circuit is disabled (e.g., the selected clock signal 280 is the first base clock signal 252a), in the regular CDR mode, the LCPLL 250a generates the correct clock frequency based on a reference frequency Fref of the RX reference clock 222 and the LCPLL 250a may divide ratio N and output the first base clock signal 252a having a frequency of N*Fref. In this depicted example, when, for example, 112 Gbps PAM4 operation is used, the Nyquist frequency of the data signal would be, for example, 28 GHz. Quadrature phases of a clock signal having a frequency of, for example, 14 GHz may be used to reduce clock distribution power. The clock signal having the frequency of 14 GHz may be then sent to the PI 260 which takes incoming phase code information from the closed loop CDR 216 and rotates the clock phase of the sampling clock signal 246 at the ADC 230. Incoming data Din is sampled by the ADC 230 and processed by the DSP 235 based on CDR algorithm, and an output PI code information (e.g., the PI code signal 242) may be then generated. This may continue until the CDR 216 locks to the optimum point to minimize the bit error rate (BER).

When the AUX CDR circuit is enabled (e.g., the selected clock signal 280 is the second base clock signal 252b), the LCPLL 250a may be disabled and the selection circuit 278 chooses the AUX CDR path. The AUX CDR circuit 218 gets the data input (e.g., the incoming data Din) from, for example, receiver pads and passes the input through the second CTLE 270. As discussed before, the second CTLE 270 may have five stages and may be used with tcoils to provide very large amount of peaking at, for example, 28 GHz. With this peaking, only the Nyquist content of the incoming data would be boosted, and the rest content of the incoming data would be suppressed. The CTLE output Dinb is then sent to the second PLL 272. The exemplary operation of the second PLL 272 will be described in further detail with reference to FIG. 3.

Figure 3:
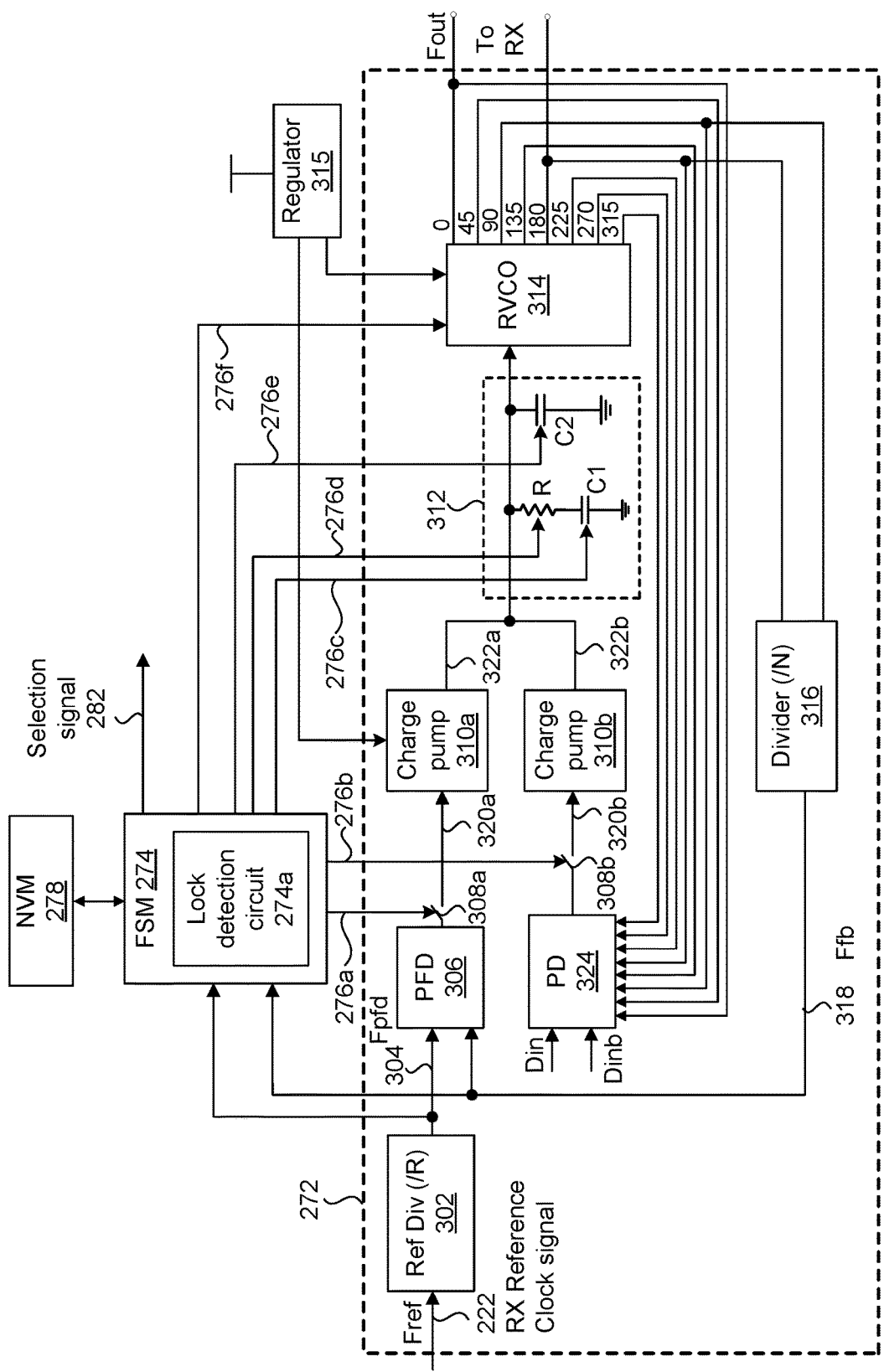
FIG. 3 depicts a block diagram of an exemplary phase-locked loop (PLL) implemented in the AUX CDR circuit.

FIG. 3 depicts a block diagram of an exemplary phase-locked loop (PLL) implemented in the AUX CDR circuit. As discussed with reference to FIG. 2B, the second PLL 272 includes a phase-frequency detector (PFD)-based PLL and a phase detector (PD)-based PLL. The second PLL 272 may be configured to work in two different modes: PFD-based mode (e.g., only the PFD path is enabled) and PD-based mode (e.g., only the PD path is enabled).

The phase-frequency detector (PFD)-based PLL includes a reference divider 302 configured to receive the RX reference clock signal 222 having a frequency of Fref and generate a first divided clock signal 304 having a frequency of Fpfd. The PFD-based PLL includes a PFD 306, a first charge pump system 310a, a loop filter (LF) 312, a ring-voltage-controlled oscillator (RVCO) 314 and an N-fold digital divider 316. N may be any positive integer. In some embodiments, the VCO 2312 may be an LCVCO. The N-fold digital divider 316 generates a second divided clock signal 318 having a frequency of Ffd. The PFD-based PLL may be enabled or disabled by controlling (e.g., through a control signal 276a) a switch 308a arranged between the PFD 306 and the first charge pump system 310a. In some embodiments, the first charge pump system 310a may include a number of (e.g., 8, 10, 14) charge pump circuits. Each charge pump circuit may provide current between, for example, 5 uA-1 mA.

The PFD 306 compares positive-going edges of the first divided clock signal 304 to the second divided clock signal 318 and generate a comparison signal 320a. The comparison signal 320a is then received by the first charge pump system 310a. The first charge pump system 310a transforms the comparison signal 320a into a control voltage signal 322a whose value at a given instant in time depends on the inputs received from the PFD 306. The control voltage signal 322a drives the LF 312 with current pulses whose widths are proportional to the phase difference between the two clock signals received by the PFD 306. The pulses are low-pass filtered by the LF 312 and the resulting waveform drives the RVCO 314. A regulator 315 may be configured to provide power supply for the first charge pump system 310a and the RVCO 314.

In this depicted example, the LF 312 includes a resistor R connected with a first capacitor C1 in series, and a second capacitor C2 connected with the resistor R and the first capacitor C1 in parallel. In this depicted example, the RVCO 314 is configured to generate eight clock signals having the same frequency Fout and different phases. Fout=N*Fpfd. The phase difference between two adjacent clock signals of the eight clock signals may be, for example, 45 degrees. The clock signal 304 having the frequency Fpfd and the clock signal 318 having the frequency Ffd are received by the FMS 274.

The phase detector (PD)-based PLL includes a phase detector (PD) 324 configured to receive the incoming data Din and the second equalized analog signal Dinb in response to, for example, the eight clock signals with eight phases generated by the RVCO 314 to capture, for example, eight samples of the incoming data Din. These samples may be then compared to determine early/late information 308b. The early/late information 308b may be then used to control a second charge pump circuit 310b to either increase or decrease the RVCO output phase until both frequency lock and phase lock are achieved to the incoming data Din. In some embodiments, the second charge pump system 310b may include a number of (e.g., 8, 10, 12) charge pump circuits. Each charge pump circuit may provide, for example, current between 5 uA~0.3 mA.

The PD-based PLL may be enabled or disabled by controlling (e.g., through a control signal 276b) a switch 308b arranged between the FD 324 and the second charge pump system 310b. The second charge pump system 310b transforms the phase difference into a control voltage signal 322b whose value at a given instant in time depends on the inputs received from the phase detector 324. In this depicted example, the PFD-based PLL and the PD-based PLL share the LP 312 and the RVCO 314 to reduce the area of the second PLL 272. The capacitance values of the first capacitor C1, the second capacitor C2, and the resistance of the resistor R may be programmed in response to control signals 276c-276e generated by the FSM 274. For example, when the second PLL is configured to work in the PFD-based mode, a first set of values may be applied to the resistor R and the capacitances in the LP 312. And when the second PLL 272 is configured to work in the PD-based mode, a second set of values may be applied to the resistor R and the capacitances in the LP 312.

The exemplary operations of the receiver 204, the second PLL 272 and the FMS 274 are now further explained. At the beginning of the receiver 204 operation, the AUX CDR circuit 218 may need to acquire frequency lock. The PFD-based PLL uses the on-chip reference frequency (e.g., Fref). Since the free-running frequency of the RVCO 314 may be far away from the desired output frequency, the FSM 274 may be configured to perform frequency hunting and bring the RVCO to the vicinity of the target operation frequency (e.g., N*Fref).

The FSM 274 may perform operations stored in the NVM 278 to generate control signals to enable the PFD path (e.g., the reference divider 302, the PFD 306, the charge pump system 310a, and the feedback divider 316), set the capacitances and resistance of the elements in the LP 312, disable the PD path (e.g., the PD 324 and the charge pump system 310b), and generate the selection signal 282 to output the first base clock signal 252a. Then, the PFD-based PLL goes into its phase lock mode and locks its phase to the incoming reference as well. Once lock is achieved, a lock detection circuit 274a in the FSM 274 generates a signal (e.g., pll_locked signal) (not shown) to indicate that the PFD-based PLL is both frequency and phase locked to the RX reference clock signal 222.

As the on-chip reference (e.g., the RX reference clock signal 222) will have a ppm frequency difference from the incoming data Din, thus, locking to the reference frequency Fref would be close to the correct data frequency, but is not enough to achieve true frequency and phase lock to the incoming data Din. Once the pll_locked signal is asserted, the FSM 274 may then generate control signals 276a-276d to disable the PFD path, enable the PD path, set the capacitances and resistance of the elements in the LP 312, and generate the selection signal 282 to output the second base clock signal 252b. As an over-sampled AUX CDR structure is implemented, the early/late information 320b of the incoming data Din can be generated. By using the oversampled architecture, strict linearity requirement from the front end may be advantageously reduced or eliminated, and large peaking stages at the CTLE may be used without needing strict adaptation schemes to limit over peaking.

When the FSM 274 disables the PFD path and uses the PD path, the large gain of the PD 324 may lead to very wide bandwidth. To ensure stability of the second PLL 272, the resistance and capacitances in the LP 312 may updated accordingly in response to the control signals generated by the FSM 274. For example, when the second PLL 272 is working in the PFD-based mode, the resistance of the resistor R may be 0.2KΩ. The capacitance of C1 may be 180 pF, and the capacitance of C2 may be 0.5 pF. When the second PLL 272 is configured to work in the PD-based mode, the resistance of the resistor R may be updated to 8 KΩ. The capacitance of C1 may be updated to 340 pF, and the capacitance of C2 may be adjusted to 6 pF.

The wide bandwidth of the second PLL 272 may advantageously lead to a large acquisition range. Therefore, even if the ppm difference between the incoming data Din and the frequency (e.g., N*Fref) of the PLL in PFD mode is large, once the PD-based mode is enabled, the AUX CDR circuit 218 may also acquire the correct frequency and lock. The AUX CDR circuit 218 may also track large spread spectrum clocking parts per million (SSC ppm) patterns.

In some embodiments, the baud rate CDR path (from the ADC 230 to the PI 260) does not need to be disabled and may work together with the AUX CDR path. The AUX CDR path may create the clock signal that is locked to and tracking the incoming data Din, and the baud rate CDR path may generate a corresponding PI code to offset the clock phase if needed. Thus, the baud rate CDR path may still slowly compensate for mismatches and offsets though the use of the PI 260, and the ppm tracking and acquisition may be handled by the fast AUX CDR path. Thus, large ppm differences may be acquired and tracked, and clock jitter filtering may also be better due to a large CDR corner frequency.

In some embodiments, by implementing the AUX CDR circuit 218, the receiver 204 may support many different data rates and standards, from, for example, 32 Gbps NRZ up to 112 Gbps PAM4, and the second PLL 272 may have a continuous 2× frequency range from, for example, 7 GHz to 14 GHz.

Figure 4A:
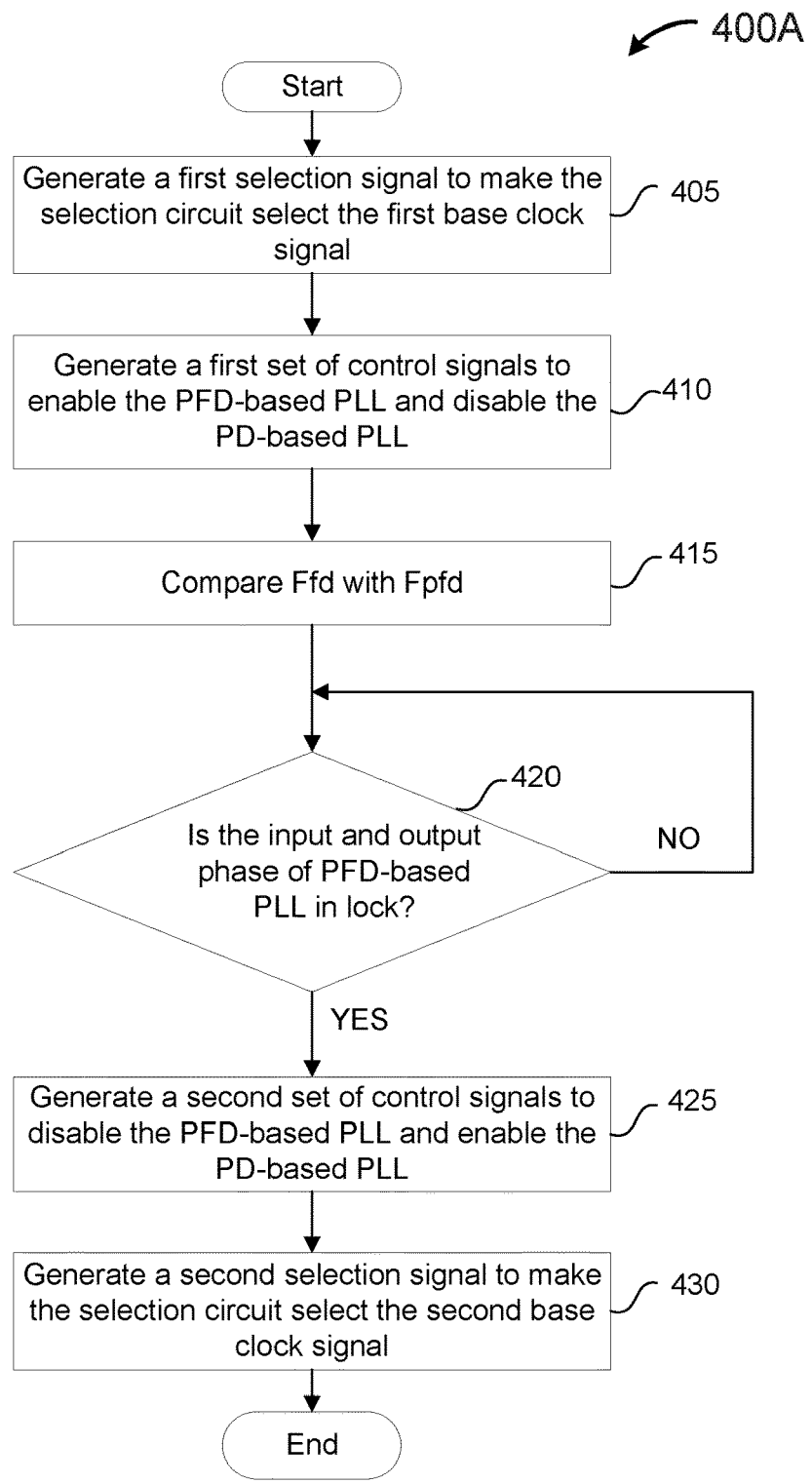
FIG. 4A depicts a flow chart of exemplary operations to be performed by a finite state machine implemented in the AUX CDR circuit.

FIG. 4A depicts a flow chart of exemplary operations to be performed by a finite state machine implemented in the AUX CDR circuit. Exemplary operations 400 to be performed by the FSM 274 include, at 405, generating a first selection signal (e.g., the selection signal 282) to make the selection circuit (e.g., the selection circuit 278) select a first base clock signal (e.g., the first base clock signal 252a generated by a clock generation circuit having the LCPLL 250a) to be applied to a phase interpolator (e.g., the PI 260).

Exemplary operations 400 also include, at 410, generating a first set of control signals (e.g., control signals 276a-276d) to enable the PFD-based PLL and disable the PD-based PLL in the second PLL 272. More specifically, the FSM 274 may generate control signals 276a-276d to control the switches 308a, 308b (e.g., switch 308a is closed and switch 308b is opened) and adjust the values of the resistor and capacitors in the loop filter 312. Exemplary operations 400 also include, at 415, comparing the frequency Ffd of the second divided clock signal 318 with the frequency Fpfd of the first divided clock signal 304.

Exemplary operations 400 also include, at 420, determining whether the input and output phase (and frequency) of the PDF-based PLL is in lock. If the PFD-based PLL is not both frequency and phase locked to the RX reference clock signal 222, then the method loops back to 425.

If the PFD-based PLL is both frequency and phase locked to the RX reference clock signal 222, then, exemplary operations 400 also include, at 425, generating a second set of control signals (e.g., control signals 276a-276d) to disable the PFD-based PLL, enable the PD-based PLL, and adjust the resistance and capacitances in the LF 312. The second PLL is then configured to work in the PD-based mode to generate a clock signal that is locked to and tracking the incoming data Din.

Exemplary operations 400 also include, at 430, generating a second selection signal (e.g., the selection signal 282) to make the selection circuit 278 select a second base clock signal (e.g., the second base clock signal 252b generated by the AUX CDR circuit 218). The wide bandwidth of the second PLL 272 may advantageously lead to a large acquisition range. Therefore, even if the ppm difference between the incoming data Din and the frequency (e.g., N*Fref) of the PLL in PFD mode is large, once the PD-based mode is enabled, the AUX CDR circuit 218 may also acquire the correct frequency and lock. The AUX CDR circuit 218 may also track large spread spectrum clocking parts per million (SSC ppm) patterns.

Figure 4B:
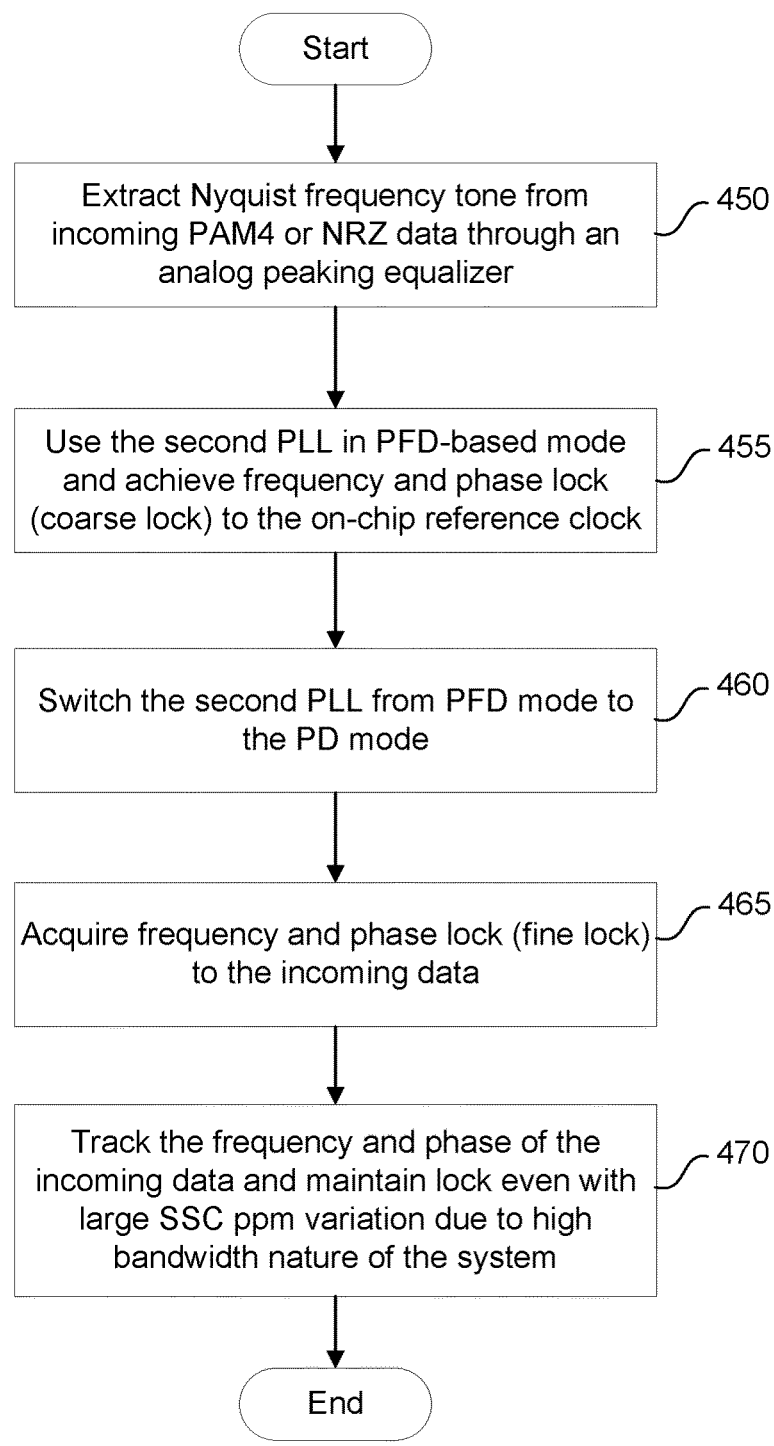
FIG. 4B depicts a flow chart of an exemplary method of operating the exemplary PLL in FIG. 3.

FIG. 4B depicts a flow chart of an exemplary method of operating the exemplary PLL in FIG. 3. An exemplary method 400B of operating the second PLL 272 includes, at 450, extracting, for example, the Nyquist frequency content from an incoming PAM4 or NRZ data (e.g., the incoming data Din) through an analog peaking equalizer (e.g., the second CTLE 270). The exemplary method 400B also includes, at 455, using the second PLL in the PFD-based mode and achieving frequency and phase lock (e.g., coarse lock) to the on-chip reference clock (e.g., the RX clock signal 222).

The exemplary method 400B also includes, at 460, switching the second PLL from the PFD-based mode to the PD-based mode (e.g., in response to the control signals 276a-276d) when the course frequency lock is achieved. The exemplary method 400B also includes, at 465, acquiring frequency and phase lock (e.g., fine lock) to the incoming data (e.g., Din) with small latency. The exemplary method 400B also includes, at 465, tracking the frequency and phase of the incoming data. The locked frequency and phase may be advantageously maintained even with large SSC ppm variation due to the high bandwidth nature of the AUX CDR circuit.

Figure 5A:
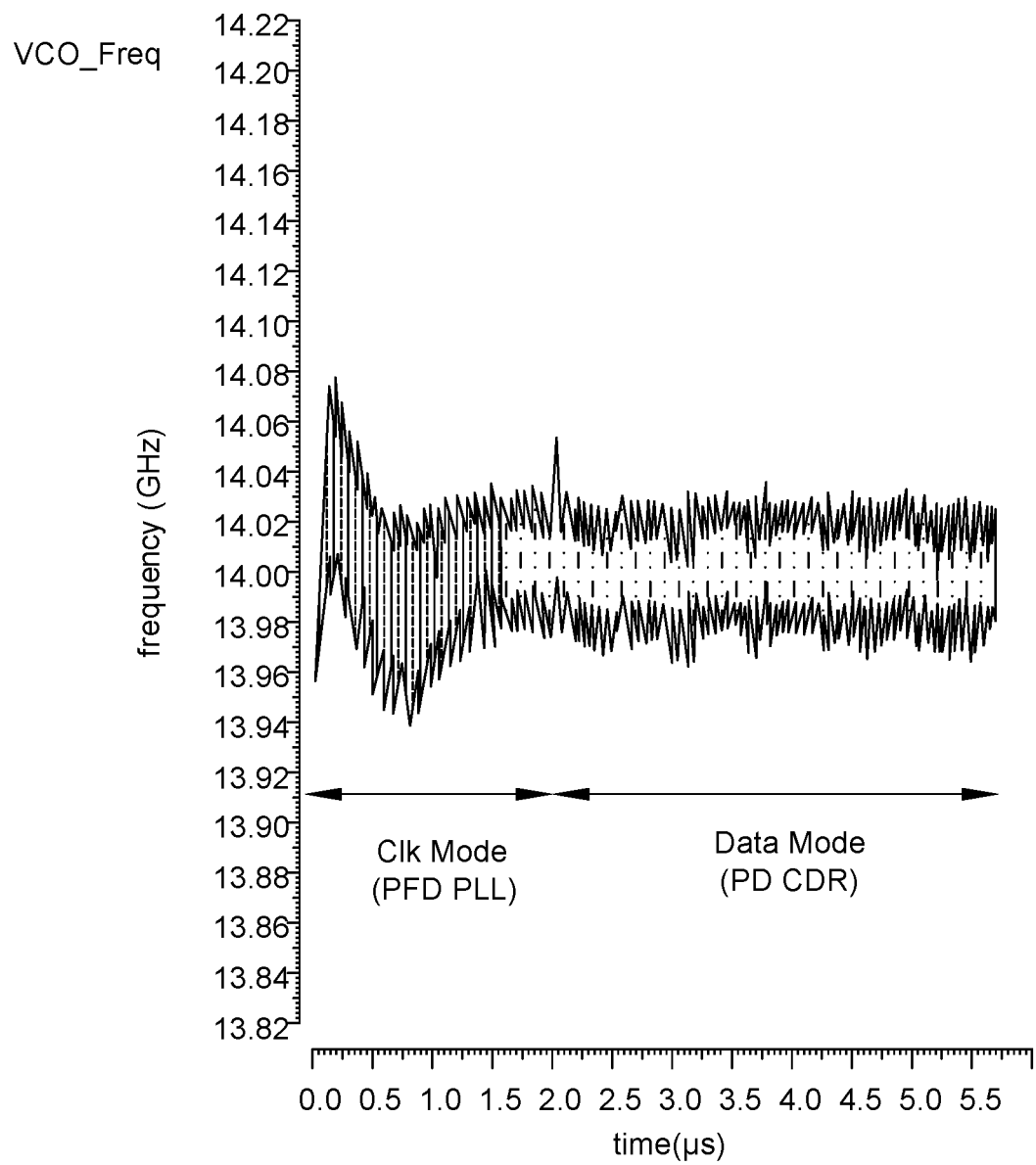
FIGS. 5A-5C depict the auxiliary CDR simulation results for 112 billion of bits per second (Gbps) Pulse-Amplitude Modulation 4-Level (PAM4) operation.
Figure 5B:
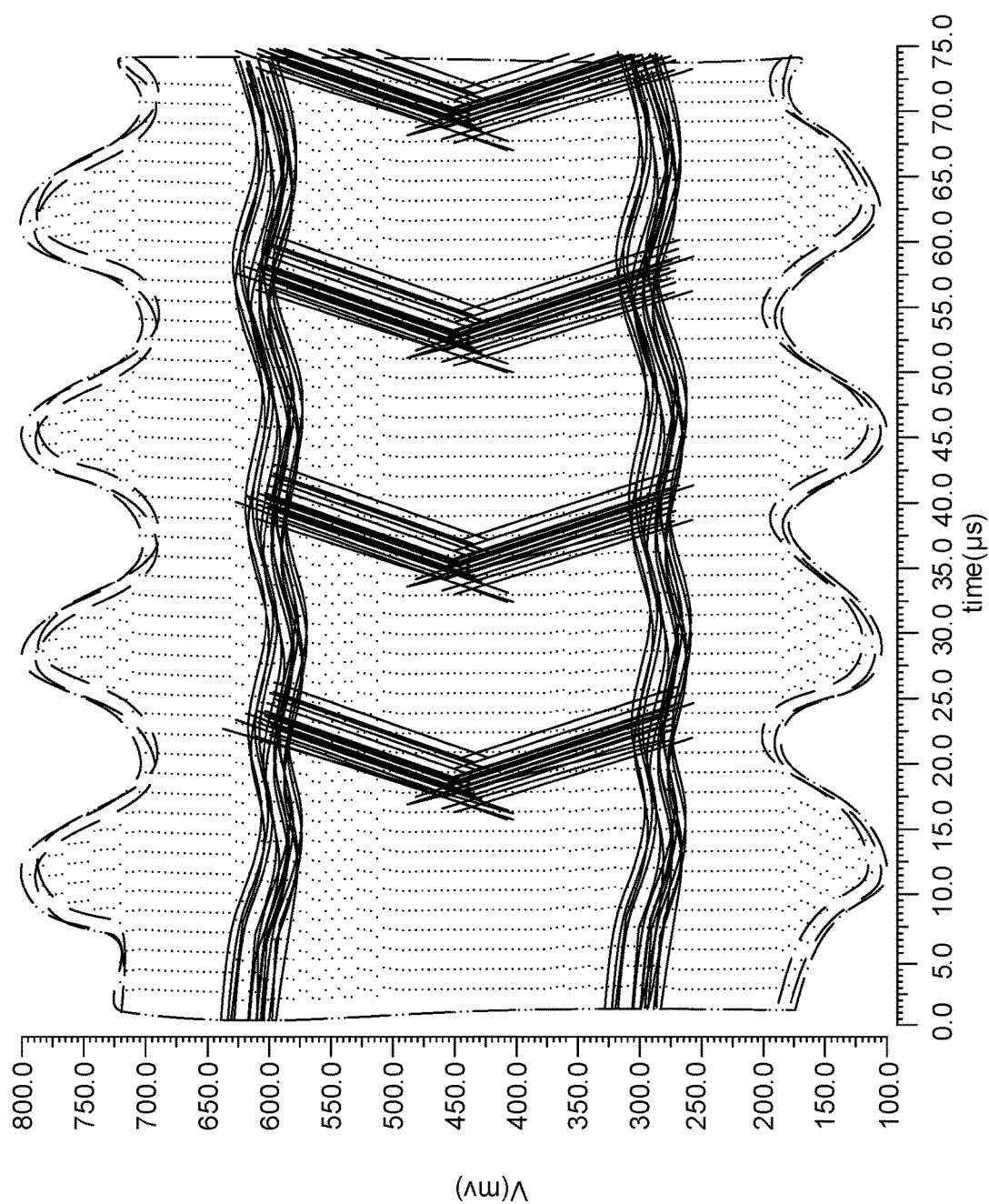
Figure 5C:
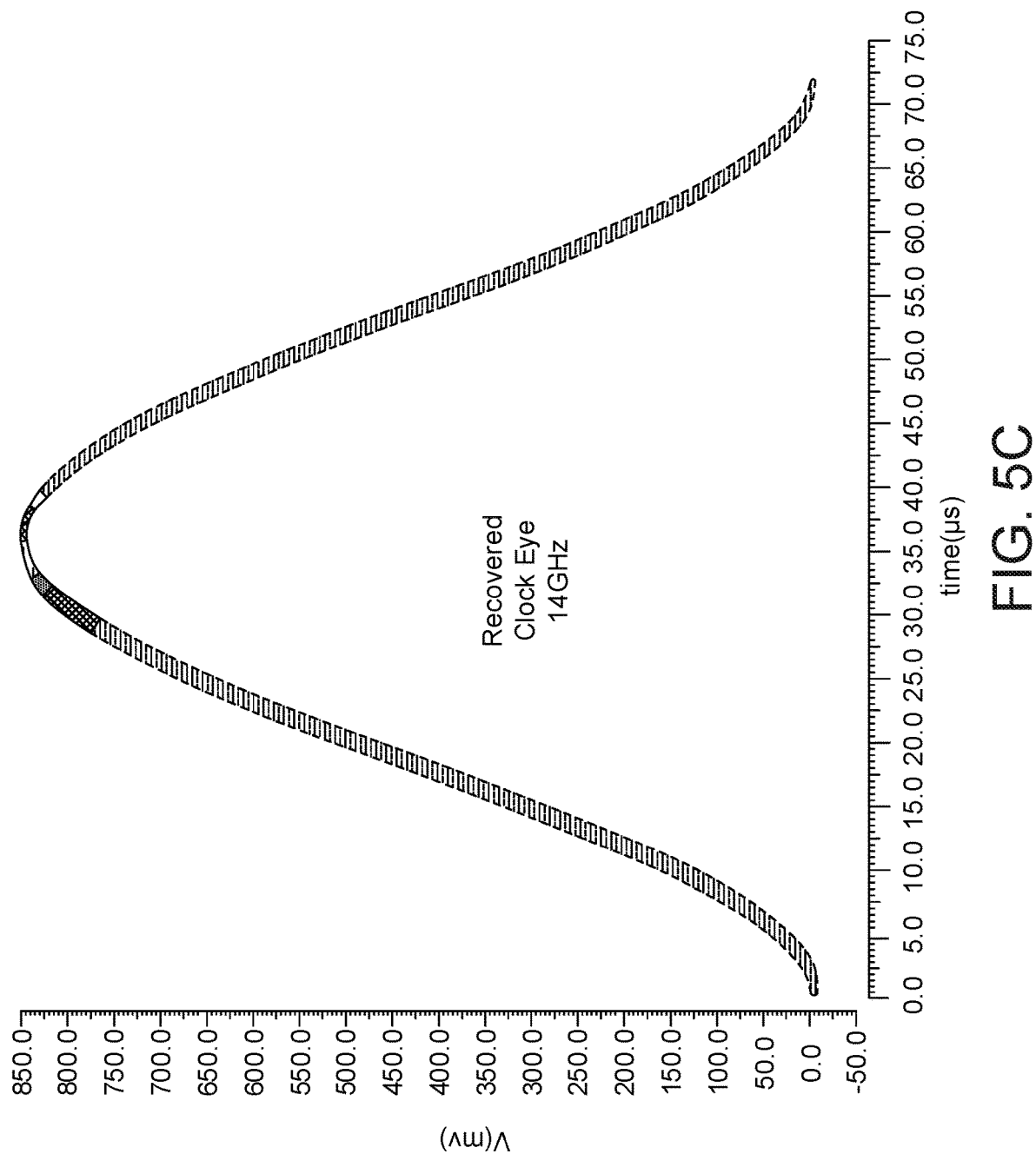

FIGS. 5A-5C depict the auxiliary CDR simulation results for 112 billion of bits per second (Gbps) Pulse-Amplitude Modulation 4-Level (PAM4) operation. In this simulation, the AUX CDR circuit 218 is implemented with a 112 Gbps PAM4 compatible transceiver in 7 nm FinFET technology. FIG. 5A depicts the output frequency of the AUX CDR. At the beginning, the frequency of the output clock signal of the AUX CDR circuit is shown when the second PLL is worked in the PFD-based mode. When the frequency of the output clock signal is initially coarse locked, the second PLL is switched to work in the PD-based mode, and a fine lock (e.g., final lock) is then achieved. FIG. 5B depicts the data eye diagram at the output of the second CTLE 270. FIG. 5C depicted an exemplary recovered clock eye that peaked around 14 GHz. Since the 112 Gbps PAM4 data with channel loss generates a fully closed eye with large ISI, even after the second CTLE, the eye is still not open. However, the large peaking at the second CTLE boosts the Nyquist frequency content, the AUX CDR circuit doesn't need an open eye and is able to lock and recover the 14 GHz with the system. Thus, the robustness of the transceiver is demonstrated. The transceiver also does not need the AUX CDR path having an elaborate equalizer (e.g., the second CTLE) with adaptation or an open eye. The Nyquist frequency can also be easily peaked so that the AUX CDR may lock even to a closed eye.

Figure 6:
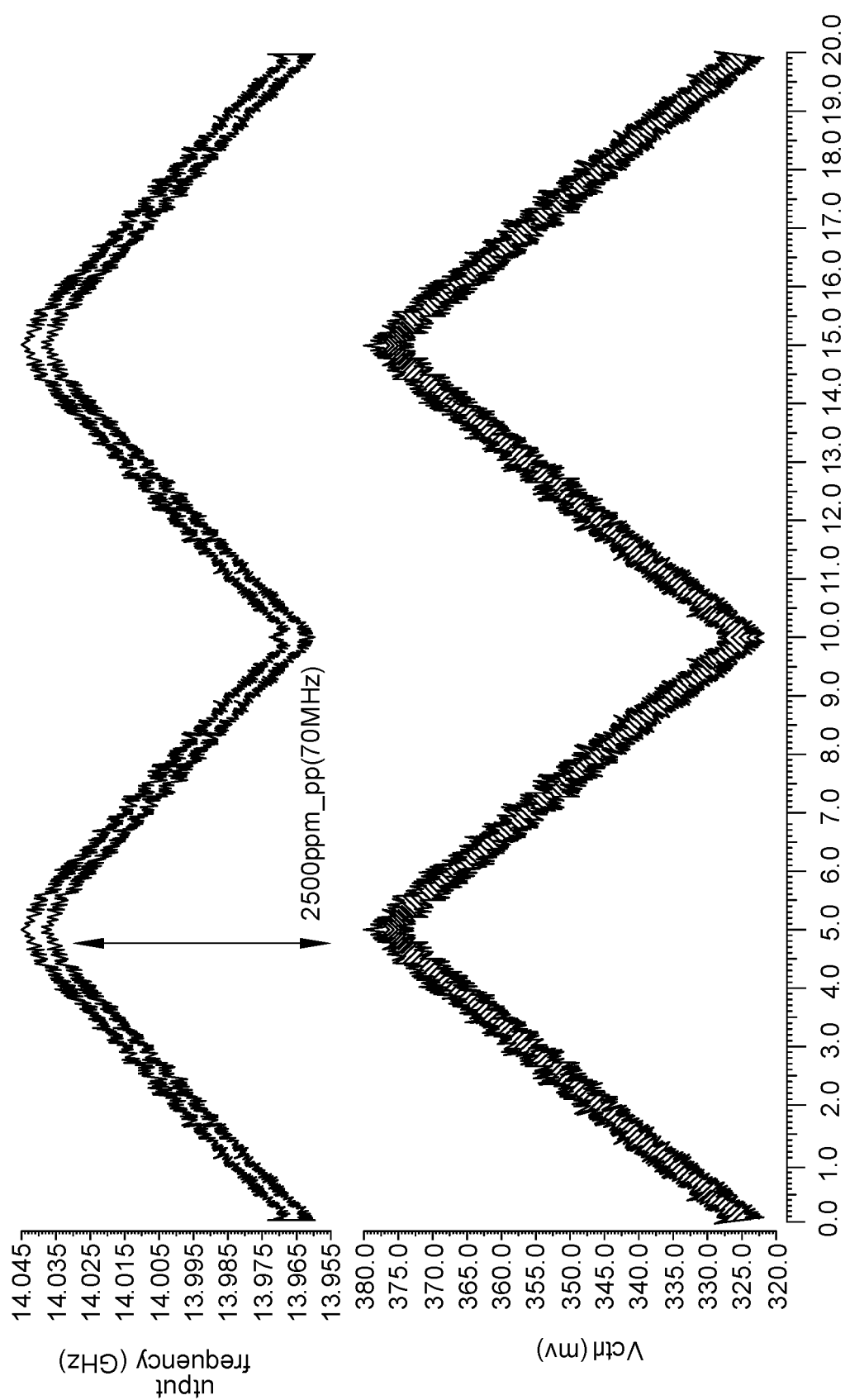
FIG. 6 depicts the auxiliary CDR simulation results for data with spread spectrum clocking (SSC) parts per million (ppm).

FIG. 6 depicts the auxiliary CDR simulation results for data with spread spectrum clocking (SSC) parts per million (ppm). In this simulation, the AUX CDR circuit 218 is implemented with a 112 Gbps PAM4 and 56 Gbps NRZ compatible transceiver in 7 nm FinFET technology. The top curve shows the AUX CDR circuit output frequency while the bottom curve shows the voltage control signal applied to the RVCO showing that the second PLL remains locked to the incoming data frequency as it follows an SSC ppm pattern.

In previous depicted examples, the AUX CDR circuit 218 is arranged on the same programmable logic (e.g., FPGA) with the rest of the receiver 204. In another embodiment, the AUX CDR circuit 218 may be implemented in a different programmable logic (e.g., another FPGA) from the rest of the receiver 204.

In some embodiments, the AUX CDR circuit 218 may be implemented as hard block fixed circuitry. For example, an application specific integrated circuit (ASIC) may provide an AUX CDR circuit with customized hardware circuitry.

In some embodiments, some or all of the functions of the AUX CDR circuit 218 may be implemented in a processor that is configured to execute a set of instructions stored in a data store to perform the tracking and acquisition. The processor may be arranged on the same integrated circuit, which may be an FPGA with the receiver 204. For example, the state machine 274 and the data store 278 may be implemented in a programmable logic block of a system-on-chip (SOC) or implemented in a hard block using fixed circuitry of the SOC, and the CTLE 270 and the second PLL 272 may be implemented in another hard block using, for example, fixed circuitry of the SOC.

Figure 7:
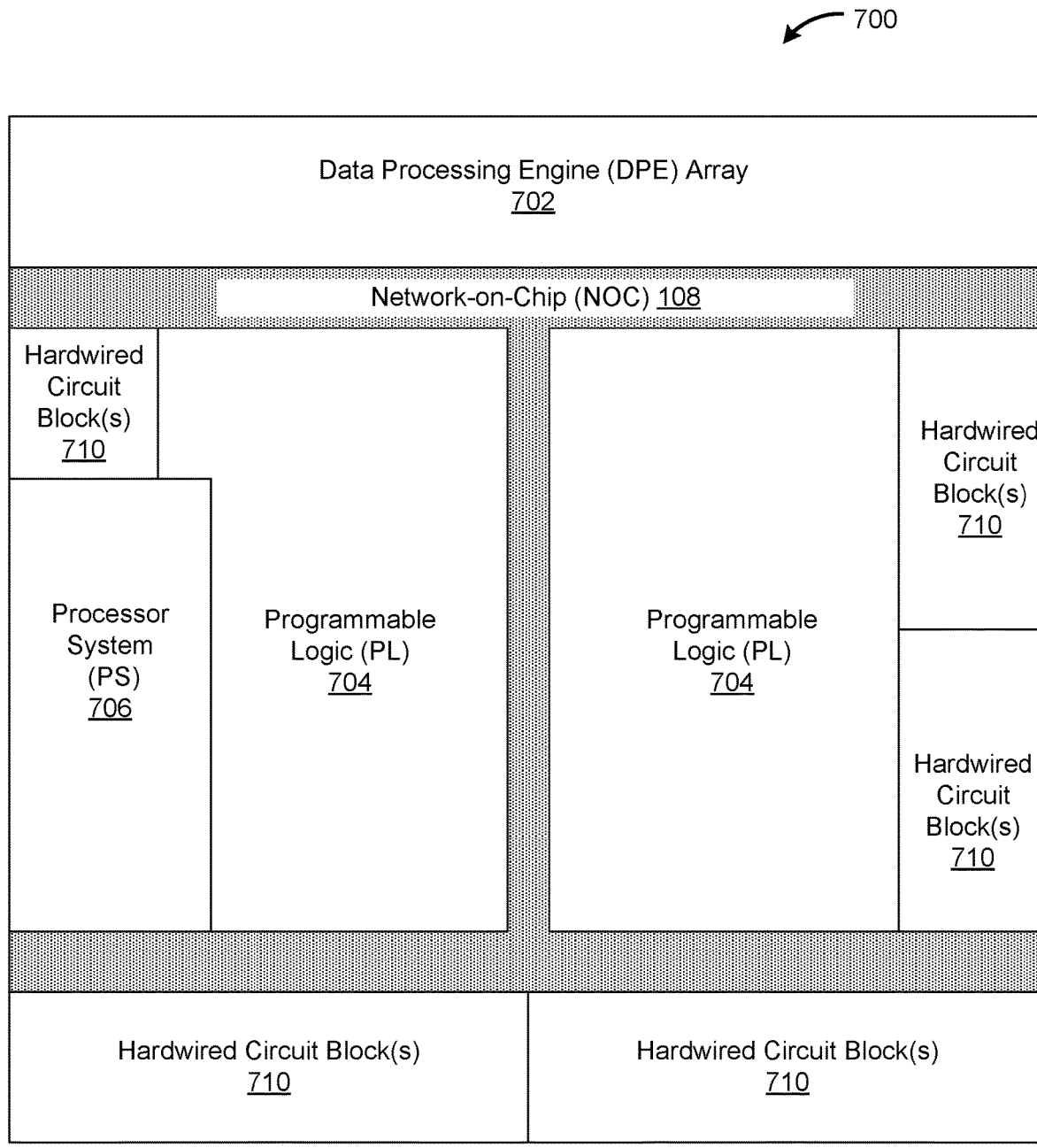
FIG. 7 depicts an exemplary architecture for a System-on-Chip (SOC) type of integrated circuit (IC) on which the disclosed circuits and processes may be implemented.

FIG. 7 depicts an exemplary architecture for a System-on-Chip (SOC) type of integrated circuit (IC) on which the disclosed circuits and processes may be implemented. A SOC 700 is an example of a programmable IC and an integrated programmable device platform. In the example of FIG. 7, the various, different subsystems or regions of the SOC 700 illustrated may be implemented on a single die provided within a single integrated package. In other examples, the different subsystems may be implemented on a plurality of interconnected dies provided as a single, integrated package.

In the example, the SOC 700 includes a plurality of regions having circuitry with different functionalities. In the example, the SOC 700 optionally includes a data processing engine (DPE) array 702. The SOC 700 includes programmable logic (PL) regions 704 (hereafter PL region(s) or PL), a processing system (PS) 706, a Network-on-Chip (NOC) 708, and one or more hardwired circuit blocks 710. The DPE array 702 is implemented as a plurality of interconnected, hardwired, and programmable processors having an interface to the other regions of the SOC 700.

The PL 704 is circuitry that may be programmed to perform specified functions. As an example, the PL 704 may be implemented as field programmable gate array type of circuitry. The PL 704 can include an array of programmable circuit blocks. Examples of programmable circuit blocks within the PL 704 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within the PL 704 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 706 is implemented as hardwired circuitry that is fabricated as part of the SOC 700. The PS 706 may be implemented as, or include, any of a variety of different processor types each capable of executing program code. For example, the PS 706 may be implemented as an individual processor, e.g., a single core capable of executing program code. In another example, the PS 706 may be implemented as a multicore processor. In still another example, the PS 706 may include one or more cores, modules, co-processors, interfaces, and/or other resources. The PS 706 may be implemented using any of a variety of different types of architectures. Example architectures that may be used to implement the PS 706 may include, but are not limited to, an ARM processor architecture, an x86 processor architecture, a GPU architecture, a mobile processor architecture, a DSP architecture, or other suitable architecture that is capable of executing computer-readable instructions or program code.

NOC 708 includes an interconnecting network for sharing data between endpoint circuits in the SOC 700. The endpoint circuits can be disposed in the DPE array 702, the PL regions 704, the PS 706, and/or in the hardwired circuit blocks 710. The NOC 708 can include high-speed data paths with dedicated switching. In an example, the NOC 708 includes horizontal paths, vertical paths, or both horizontal and vertical paths. The arrangement and number of regions shown in FIG. 7 is merely an example. The NOC 708 is an example of the common infrastructure that is available within the SOC 700 to connect selected components and/or subsystems.

The NOC 708 provides connectivity to the PL 704, the PS 706, and to selected ones of the hardwired circuit blocks 710. The NOC 708 is programmable. In the case of a programmable NOC used with other programmable circuitry, the nets that are to be routed through the NOC 708 are unknown until a user circuit design is created for implementation within the SOC 700. The NOC 708 may be programmed by loading configuration data into internal configuration registers that define how elements within the NOC 708 such as switches and interfaces are configured and operate to pass data from switch to switch and among the NOC interfaces.

The NOC 708 is fabricated as part of the SOC 700 and while not physically modifiable, may be programmed to establish connectivity between different master circuits and different slave circuits of a user circuit design. The NOC 708, for example, may include a plurality of programmable switches that are capable of establishing packet switched network connecting user specified master circuits and slave circuits. In this regard, the NOC 708 is capable of adapting to different circuit designs, where each different circuit design has different combinations of master circuits and slave circuits implemented at different locations in the SOC 700 that may be coupled by the NOC 708. The NOC 708 may be programmed to route data, e.g., application data and/or configuration data, among the master and slave circuits of the user circuit design. For example, the NOC 708 may be programmed to couple different user-specified circuitry implemented within the PL 704 with the PS 706, and/or the DPE array 702, with different hardwired circuit blocks, and/or with different circuits and/or systems external to the SOC 700.

The hardwired circuit blocks 710 may include input/output (I/O) blocks, and/or transceivers for sending and receiving signals to circuits and/or systems external to the SOC 700, memory controllers, or the like. Examples of different I/O blocks may include single-ended and pseudo differential I/Os and high-speed differentially clocked transceivers. Further, the hardwired circuit blocks 710 may be implemented to perform specific functions. Examples of the hardwired circuit blocks 710 include, but are not limited to, cryptographic engines, digital-to-analog converters, analog-to-digital converters, and the like. The hardwired circuit blocks 710 within the SOC 700 may be referred to herein from time-to-time as application-specific blocks.

In the example of FIG. 7, the PL 704 is shown in two separate regions. In another example, the PL 704 may be implemented as a unified region of programmable circuitry. In still another example, the PL 704 may be implemented as more than two different regions of programmable circuitry. The particular organization of the PL 704 is not intended as a limitation. In this regard, the SOC 700 includes one or more PL regions 704, the PS 706, and the NOC 708. The DPE array 702 may be optionally included.

In other example implementations, the SOC 700 may include two or more DPE arrays 702 located in different regions of the IC. In still other examples, the SOC 700 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, in some embodiments, to achieve CDR bandwidth on the order of, for example, 80-100 MHz, more than 20 times higher than the digital CDR loop may be used, while having a wide range of operation and supporting, for example, 112 Gbps PAM4, 64 Gbps PAM4, 56 Gbps NRZ, 32 Gbps NRZ links and for high loss (e.g., about 30 dB at Nyquist rate) channels as well as low loss (e.g., about 0 dB) channels. The frequency range of the second PLL may be able to support these data rates and all data rates in between, for example, may be a continuous 2× range from, for example, 7 GHz to 14 GHz, such that the transceiver may be able to meet and exceed the static and dynamic ppm tracking requirements (e.g., around 3400 ppm) for PCIe 5.0 and PCIe 6.0, for example. Some embodiments may further provide a solution for future standards that will be developed for, for example, 112 Gbps operation.

In some embodiments, the CTLE in the auxiliary CDR path may have tcoils and/or shunt peaking. In some embodiments, the CTLE in the auxiliary CDR path may be implemented in difference ways. For example, the CTEL may include a CML-based CTLE and/or a CMOS-based CTLE. In some embodiments, the PLL 272 may be implemented with an LC oscillator instead of a ring oscillator.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An integrated circuit, comprising:
   an analog-to-digital converter (ADC)-based receiver configured to receive an incoming data signal in response to a reference clock signal;
   a clock generation circuit configured to receive the reference clock signal and generate a first clock signal;
   an analog auxiliary clock and data recovery (AUX CDR) circuit configured to oversample the incoming data signal and generate a second clock signal and a corresponding selection signal;
   a selection circuit configured to receive the first clock signal and the second clock signal and output a selected clock signal in response to the corresponding selection signal; and,
   a phase interpolator (PI) configured to provide a sampling clock signal to an ADC in the ADC-based receiver in response to a PI code and the selected clock signal,
   wherein the selection circuit is configured to output the second clock signal when a phase-frequency detector (PFD)-based phase-locked loop (PLL) in the AUX CDR circuit is locked to the reference clock signal.

2. The integrated circuit of claim 1, wherein the AUX CDR circuit comprises:
   an analog equalizer configured to receive the incoming data signal and generate a first equalized signal; and,
   a phase-locked loop (PLL) configured to receive the incoming data signal, the first equalized signal, and the reference clock signal to generate the second clock signal, wherein the PLL comprises:
      the PFD-based PLL configured to receive the reference clock signal to generate a third clock signal; and,
      a phase detector (PD)-based PLL configured to receive the incoming data signal, the first equalized signal, and the third clock signal to generate the second clock signal;
   wherein when the PFD-based PLL is locked to the reference clock signal, the PFD-based PLL is disabled and the PD-based PLL is enabled in response to a set of control signals.

3. The integrated circuit of claim 2, wherein the analog equalizer comprises a continuous time linear equalizer.

4. The integrated circuit of claim 2, wherein the PLL comprises:

a first divider configured to receive the reference clock signal;
a phase-frequency detector (PFD) coupled to an output of the first divider;
a first charge pump circuit coupled to an output of the PFD through a first switch;
a phase detector (PD) configured to receive the incoming data signal and the first equalized signal;
a second charge pump circuit coupled to an output of the PFD through a second switch;
a loop filter coupled to both the first charge pump circuit and the second charge pump circuit; and,
a voltage-controlled oscillator (VCO) coupled to the loop filter to provide a number of clock signals,
wherein the phase detector (PD) is configured to receive the incoming data signal and the first equalized analog signal in response to the number of clock signals to capture a number of samples of the incoming data signal.

5. The integrated circuit of claim 4, wherein the VCO comprises a ring VCO.

6. The integrated circuit of claim 2, wherein the AUX CDR circuit further comprises:
a state machine operably coupled to the PFD-based PLL and the PD-based PLL; and,
a data store coupled to the state machine and containing a program of instructions that, when executed by the state machine, cause the state machine to perform operations to control the PFD-based PLL and the PD-based PLL, the operations comprising:
generating a first set of control signals to enable the PFD-based PLL and disable the PD-based PLL;
determining whether the PFD-based PLL is locked to the reference clock signal; and,
if the PFD-based PLL is locked to the reference clock signal, then generating a second set of control signals to disable the PFD-based PLL and enable the PD-based PLL.

7. The integrated circuit of claim 6, wherein the operations further comprise:
generating the first set of control signals to assign a first predetermined set of resistance value and capacitance values to a loop filter in both the PFD-based PLL and the PD-based PLL; and,
if the PFD-based PLL is locked to the reference clock signal, then, generating the second set of control signals to assign a second predetermined set of resistance value and capacitance values to the loop filter.

8. The integrated circuit of claim 6, wherein the operations further comprise:
generating a first selection signal to enable the selection circuit to output the first clock signal;
determining whether the PFD-based PLL is locked to the reference clock signal; and,
if the PFD-based PLL is locked to the reference clock signal, then generating a second selection signal to enable the selection circuit to output the second clock signal.

9. An integrated circuit configured to receive an incoming data signal in response to a reference clock signal, the integrated circuit comprising:
an analog-to-digital converter (ADC) configured to convert the incoming data signal into a digital data signal in response to a sampling clock signal;
a decision circuit configured to receive the digital data signal and generate data samples and error samples;
a first clock and data recovery (CDR) circuit configured to generate a phase interpolator (PI) code signal in response to the data samples and error samples;
a clock generation circuit configured to receive the reference clock signal and generate a first clock signal;
a second clock and data recovery (AUX CDR) circuit configured to oversample the incoming data signal and generate a second clock signal and a corresponding selection signal;
a selection circuit configured to receive the first clock signal and the second clock signal and output a selected clock signal in response to the corresponding selection signal; and,
a phase interpolator (PI) configured to provide the sampling clock signal in response to the PI code signal and the selected clock signal,
wherein the selection circuit is configured to output the second clock signal when a phase-frequency detector (PFD)-based phase-locked loop (PLL) in the second CDR circuit is locked to the reference clock signal.

10. The integrated circuit of claim 9, wherein the second CDR circuit comprises:
an analog equalizer configured to receive the incoming data signal and generate a first equalized signal; and,
a phase-locked loop (PLL) configured to receive the incoming data signal, the first equalized signal, and the reference clock signal to generate the second clock signal, wherein the PLL comprises:
the PFD-based PLL configured to receive the reference clock signal to generate a third clock signal; and,
a phase detector (PD)-based PLL configured to receive the incoming data signal, the first equalized signal, and the third clock signal to generate the second clock signal,
wherein when the PFD-based PLL is locked to the reference clock signal, the PFD-based PLL is disabled and the PD-based PLL is enabled in response to a set of control signals.

11. The integrated circuit of claim 10, wherein the analog equalizer comprises a continuous time linear equalizer.

12. The integrated circuit of claim 10, wherein the second CDR circuit further comprises:
a state machine operably coupled to the PFD-based PLL and the PD-based PLL; and,
a data store coupled to the state machine and containing a program of instructions that, when executed by the state machine, cause the state machine to perform operations to control the PFD-based PLL and the PD-based PLL, the operations comprising:
generating a first set of control signals to enable the PFD-based PLL and disable the PD-based PLL;
determining whether the PFD-based PLL is locked to the reference clock signal; and,
if the PFD-based PLL is locked to the reference clock signal, then generating a second set of control signals to disable the PFD-based PLL and enable the PD-based PLL.

13. The integrated circuit of claim 12, wherein the operations further comprise:
generating the first set of control signals to assign a first predetermined set of resistance value and capacitance values to a loop filter in both the PFD-based PLL and the PD-based PLL; and,
if the PFD-based PLL is locked to the reference clock signal, generating the second set of control signals to assign a second predetermined set of resistance value and capacitance values to the loop filter.

14. The integrated circuit of claim 12, wherein the operations further comprise:
generating a first selection signal to enable the selection circuit to output the first clock signal;
determining whether the PFD-based PLL is locked to the reference clock signal; and,
if the PFD-based PLL is locked to the reference clock signal, then generating a second selection signal to enable the selection circuit to output the second clock signal.

15. The integrated circuit of claim 9, wherein the first clock and data recovery (CDR) circuit comprises a baud rate CDR circuit.

16. A method, comprising:
configuring an analog-to-digital converter (ADC)-based receiver to receive an incoming data signal in response to a reference clock signal;
configuring a clock generation circuit to receive the reference clock signal and generate a first clock signal;
configuring an analog auxiliary clock and data recovery (AUX CDR) circuit to oversample the incoming data signal and generate a second clock signal and a corresponding selection signal;
configuring a selection circuit to receive the first clock signal and the second clock signal and output a selected clock signal in response to the corresponding selection signal;
configuring a phase interpolator (PI) to provide a sampling clock signal to an ADC in the ADC-based receiver in response to a PI code and the selected clock signal; and,
configuring the selection circuit to output the second clock signal when a phase-frequency detector (PFD)-based phase-locked loop (PLL) in the AUX CDR circuit is locked to the reference clock signal.

17. The method of claim 16, wherein configuring the AUX CDR circuit comprises:
configuring an analog equalizer to receive the incoming data signal and generate a first equalized signal; and,
configuring a phase-locked loop (PLL) to receive the incoming data signal, the first equalized signal, and the reference clock signal to generate the second clock signal, wherein configuring the PLL comprises:
configuring the PFD-based PLL to receive the reference clock signal to generate a third clock signal; and,
configuring a phase detector (PD)-based PLL to receive the incoming data signal, the first equalized signal, and the third clock signal to generate the second clock signal;
in response to a set of control signals, disabling the PFD-based PLL and enabling the PD-based PLL in response to a set of control signals when the PFD-based PLL is locked to the reference clock signal.

18. The method of claim 17, wherein the analog equalizer comprises a continuous time linear equalizer.

19. The method of claim 17, wherein the PLL comprises:
a first divider configured to receive the reference clock signal;
a phase-frequency detector (PFD) coupled to an output of the first divider;
a first charge pump circuit coupled to an output of the PFD through a first switch;
a phase detector (PD) configured to receive the incoming data signal and the first equalized signal;
a second charge pump circuit coupled to an output of the PFD through a second switch;
a loop filter coupled to both the first charge pump circuit and the second charge pump circuit; and,
a voltage-controlled oscillator (VCO) coupled to the loop filter to provide a number of clock signals,
wherein the phase detector (PD) is configured to receive the incoming data signal and the first equalized analog signal in response to the number of clock signals to capture a number of samples of the incoming data signal.

20. The method of claim 17, wherein configuring the AUX CDR circuit further comprises:
providing a state machine and operably coupling the state machine to the PFD-based PLL and the PD-based PLL; and,
coupling a data store to the state machine, wherein the data store contains a program of instructions that, when executed by the state machine, cause the state machine to perform operations to control the PFD-based PLL and the PD-based PLL, the operations comprising:
generating a first set of control signals to enable the PFD-based PLL and disable the PD-based PLL;
determining whether the PFD-based PLL is locked to the reference clock signal; and,
if the PFD-based PLL is locked to the reference clock signal, then generating a second set of control signals to disable the PFD-based PLL and enable the PD-based PLL.

* * * * *